(12) United States Patent
Naoi et al.

(10) Patent No.: US 7,771,836 B2
(45) Date of Patent: Aug. 10, 2010

(54) GOLDEN ORNAMENT AND PROCESS FOR PRODUCING THE SAME

(75) Inventors: Koichi Naoi, Kawagoe (JP); Fumio Tase, Sayama (JP); Yukio Miya, Kawagoe (JP); Osamu Tanaka, Tokyo (JP); Masayoshi Ushikubo, Honjo (JP)

(73) Assignee: Citizen Holdings Co., Ltd. (JP)

( * ) Notice: Subject to any disclaimer, the term of this patent is extended or adjusted under 35 U.S.C. 154(b) by 391 days.

(21) Appl. No.: 11/910,163

(22) PCT Filed: Mar. 31, 2006

(86) PCT No.: PCT/JP2006/306955

§ 371 (c)(1),
(2), (4) Date: Sep. 28, 2007

(87) PCT Pub. No.: WO2006/106981

PCT Pub. Date: Oct. 12, 2006

(65) Prior Publication Data

US 2009/0087634 A1  Apr. 2, 2009

(30) Foreign Application Priority Data

Mar. 31, 2005  (JP) ............... 2005-103446
Mar. 28, 2006  (JP) ............... 2006-087940

(51) Int. Cl.
*B32B 9/00*  (2006.01)
*C23C 16/00*  (2006.01)
*C23C 16/34*  (2006.01)

(52) U.S. Cl. ............ 428/469; 428/472; 428/698; 427/255.23; 427/255.28; 427/255.391; 427/255.7; 427/530

(58) Field of Classification Search ......... 428/411.1, 428/457, 544, 546–548, 553–555, 567, 610, 428/615, 621, 627, 660, 663, 672, 688, 689, 428/698, 699, 704; 204/192.1, 192.16, 192.11, 204/192.12; 63/3, 12, 21; 427/248.1, 255.15, 427/255.23, 255.28, 255.391, 255.394, 255.7, 427/295, 523, 530

See application file for complete search history.

(56) References Cited

U.S. PATENT DOCUMENTS

| 4,197,175 | A | * | 4/1980 | Moll et al. | ............ 204/192.38 |
| 4,252,862 | A | | 2/1981 | Nishida | |
| 4,403,014 | A | | 9/1983 | Bergmann | |
| 4,415,421 | A | * | 11/1983 | Sasanuma | ............ 204/192.15 |
| 5,037,517 | A | * | 8/1991 | Randhawa | ............ 204/192.15 |
| 6,299,987 | B1 | * | 10/2001 | Ikeda et al. | ................ 428/627 |

FOREIGN PATENT DOCUMENTS

| JP | 54002942 A | 1/1979 |
| JP | 56156762 A | 12/1981 |
| JP | 58104176 A | 6/1983 |
| JP | 58120777 A | 7/1983 |
| JP | 60067654 A | 4/1985 |
| JP | 3031471 A | 2/1991 |

OTHER PUBLICATIONS

Ma et al., Friction and wear behavior of TiN/Au, TiN/MoS2 and TiN/TiCN/a-C:H coatings, Journald of Materials Processing Technology 127, no month 2002, p. 182-186.*

* cited by examiner

*Primary Examiner*—Timothy M Speer
(74) *Attorney, Agent, or Firm*—The Webb Law Firm

(57) ABSTRACT

A golden ornament includes a base material; a Ti coating film which is formed on a surface of the base material in an atmosphere of an inert gas other than nitrogen and whose Ti atom content is constant in the thickness direction; a TiN gradient coating film which is formed on the Ti coating film and whose N atom content has a gradient in the thickness direction; a TiN coating film which is formed on the TiN gradient coating film and whose contents of Ti atoms and N atoms are constant in the thickness direction; an Au—TiN mixture gradient coating film which is formed on the TiN coating film and whose Au atom content has a gradient in the thickness direction; and an Au—TiN mixture coating film which is formed on the Au—TiN mixture gradient coating film and whose contents of Au atoms, Ti atoms, and N atoms are constant in the thickness direction. The golden ornament may further include an Au coating film or an Au alloy coating film which is formed on the Au—TiN mixture coating film and whose Au atom content is constant in the thickness direction.

20 Claims, 2 Drawing Sheets

GOLDEN ORNAMENT AND PROCESS FOR PRODUCING THE SAME

TECHNICAL FIELD

The present invention relates to golden ornaments and processes for producing the golden ornaments.

BACKGROUND ART

Exterior components of watches and accessories are required to have both a color tone that is an ornamental factor and an abrasion resistance that is a functional factor. Gold is most suitable for this requirement. For instance, conventionally, the material of gold is processed, or a gold plating coating layer is formed on other metals. When a corrosion resistance is not required in particular, even a coating layer of 1 micrometer or less can achieve a purpose of displaying a gold color. However, a high resistance to sweat, water vapor, etc. is required for watch cases, watch bands and accessories, and therefore the gold plating layer should be at least 10 micrometers in thickness.

However, gold is an extremely expensive metal, which limits exterior components to which a gold coating layer having a large thickness can be applied. Consequently, a coating layer using a reduced amount of gold is required. Moreover, the hardness of gold is approximately 200 Hv, and gold has a low mar resistance. Accordingly, gold is easily flawed disadvantageously when a wristwatch or an accessory is carried. Therefore, it is desired that a gold coating layer that is inexpensive and displays sufficient functions is developed.

As a result, coating layers made of titanium nitride and gold or a gold alloy by dry plating technology such as ion plating or sputtering are proposed (see Patent documents 1 to 3 for instance). Consequently, a gold coating layer that has an excellent corrosion resistance, an excellent abrasion resistance, and a thin film thickness can be formed at a low cost. For the coating layer made of titanium nitride and gold or a gold alloy, an adhesion property to a base metal layer made of titanium or titanium nitride is improved as compared with a conventional gold plating coating layer. However, the adhesion property is still insufficient. In particular, when the film thickness of a coating layer made of titanium nitride and gold or a gold alloy is extremely small, the coating layer is easily peeled disadvantageously.

Moreover, an exterior component is disclosed in which a gold coating layer is composed of two layers of for example a titanium nitride layer and a gold or gold alloy layer (see Patent documents 1 and 2). This gold coating layer is described to have excellent mar resistance and abrasion resistance. However, because the color tones of the titanium nitride layer and the gold or gold alloy layer are different, abrasion or flaws on the surface of the gold coating layer are conspicuous disadvantageously.

Patent document 1: Japanese Patent Application Laid-Open Publication No. 54-2942

Patent document 2: Japanese Patent Application Laid-Open Publication No. 58-104176

Patent document 3: Japanese Patent Application Laid-Open Publication No. 60-67654

The present invention has been made in order to solve the above problems of the conventional art. An object of the present invention is to provide ornaments having a gold coating layer that is inexpensive and displays sufficient functions, and processes for producing the ornaments.

SUMMARY OF THE INVENTION

A process for producing a golden ornament in accordance with the present invention comprises the steps of:

forming a Ti coating film on a surface of a base material by evaporating titanium in a dry plating apparatus in an atmosphere of an inert gas other than nitrogen in such a manner that titanium is evaporated in a constant amount per unit time;

forming a TiN gradient coating film whose N atom content has a gradient in the thickness direction on the Ti coating film by introducing a nitrogen gas in the dry plating apparatus in such a manner that the nitrogen amount is increased with time in the dry plating apparatus while evaporating titanium in the dry plating apparatus in such a manner that titanium is evaporated in a constant amount per unit time;

forming a TiN coating film on the TiN gradient coating film by keeping the nitrogen amount constant in the dry plating apparatus while evaporating titanium in the dry plating apparatus in such a manner that titanium is evaporated in a constant amount per unit time;

forming an Au—TiN mixture gradient coating film whose Au atom content has a gradient in the thickness direction on the TiN coating film by evaporating either gold or gold and another metal in such a manner that the evaporation amount of gold per unit time is increased with time, while evaporating titanium in the dry plating apparatus in such a manner that titanium is evaporated in a constant amount per unit time and the nitrogen amount is kept constant in the dry plating apparatus; and forming an Au—TiN mixture coating film on the Au—TiN mixture gradient coating film by evaporating either titanium and gold, or titanium, gold and another metal in the dry plating apparatus in such a manner that either titanium and gold, or titanium, gold and the another metal are evaporated in a constant amount per unit time while the nitrogen amount is kept constant in the dry plating apparatus.

The process for producing a golden ornament in accordance with the present invention is preferably characterized in that, after the Au—TiN mixture coating film is formed, the evaporation of titanium in the dry plating apparatus is stopped and the supply of nitrogen to the dry plating apparatus is stopped, and either gold or gold and a metal other than gold and titanium are evaporated in the dry plating apparatus to form an Au coating film or an Au alloy coating film on the Au—TiN mixture coating film.

The process for producing a golden ornament in accordance with the present invention is preferably characterized in that when the Au—TiN mixture gradient coating film is formed, the evaporation amount of gold per unit time is increased with time in such a manner that the content of Au atoms in the Au—TiN mixture gradient coating film is increased in the thickness direction at a rate of 2 to 10 atom %/0.001 μm.

The process for producing a golden ornament in accordance with the present invention is preferably characterized in that when the Au—TiN mixture gradient coating film is formed, a nitrogen gas is supplied to the dry plating apparatus in an amount at least 2.5 times as much as the amount of a nitrogen gas supplied in forming the TiN coating film.

The process for producing a golden ornament in accordance with the present invention is preferably characterized in that when the Au—TiN mixture coating film is formed, a nitrogen gas is supplied to the dry plating apparatus in an amount at least 2.5 times as much as the amount of a nitrogen gas supplied in forming the TiN coating film.

The process for producing a golden ornament in accordance with the present invention is preferably characterized in that when the TiN gradient coating film is formed, the nitrogen amount in the dry plating apparatus is increased with time in such a manner that the content of N atoms in the TiN gradient coating film is increased in the thickness direction at a rate of 4 to 12 atom %/0.1 μm.

The process for producing a golden ornament in accordance with the present invention is preferably characterized in that Au atoms in the Au—TiN mixture gradient coating film and the Au—TiN mixture coating film form an alloy with a metal other than gold and titanium and an Au alloy coating film is formed on the Au—TiN mixture coating film.

A golden ornament according to the present invention comprises:

a base material;

a Ti coating film which is formed on a surface of the base material in an atmosphere of an inert gas other than nitrogen and whose Ti atom content is constant in the thickness direction;

a TiN gradient coating film which is formed on the Ti coating film and whose N atom content has a gradient in the thickness direction;

a TiN coating film which is formed on the TiN gradient coating film and whose contents of Ti atoms and N atoms are constant in the thickness direction;

an Au—TiN mixture gradient coating film which is formed on the TiN coating film and whose Au atom content has a gradient in the thickness direction; and an Au—TiN mixture coating film which is formed on the Au—TiN mixture gradient coating film and whose contents of Au atoms, Ti atoms and N atoms are constant in the thickness direction.

The golden ornament in accordance with the present invention preferably further comprises an Au coating film or an Au alloy coating film which is formed on the Au—TiN mixture coating film and whose Au atom content is constant in the thickness direction.

The golden ornament in accordance with the present invention is preferably characterized in that the content of Au atoms in the Au—TiN mixture gradient coating film is increased in the thickness direction from the TiN coating film to the Au—TiN mixture coating film.

The golden ornament in accordance with the present invention is preferably characterized in that the Au—TiN mixture gradient coating film does not contain metal atoms other than gold and titanium and the content of Au atoms is increased at a rate of 2 to 10 atom %/0.001 μm.

The golden ornament in accordance with the present invention is preferably characterized in that Au atoms in the Au—TiN mixture gradient coating film form an alloy with a metal other than gold and titanium, and the total content of Au atoms and atoms of the metal other than gold and titanium is increased at a rate of 2 to 10 atom %/0.001 μm.

The golden ornament in accordance with the present invention is preferably characterized in that Au atoms in the Au—TiN mixture coating film form an alloy with a metal other than gold and titanium to form an Au alloy coating film on the Au—TiN mixture coating film.

The golden ornament in accordance with the present invention is preferably characterized in that the content of N atoms in the TiN gradient coating film is increased in the thickness direction from the Ti coating film to the TiN coating film.

The golden ornament in accordance with the present invention is preferably characterized in that the content of N atoms in the TiN gradient coating film is increased at a rate of 4 to 12 atom %/0.1 μm.

The first golden ornament in accordance with the present invention is preferably characterized in that the thickness of the Ti coating film is in the range of 0.1 to 0.5 μm, the total thickness of the TiN gradient coating film and the TiN coating film is in the range of 0.5 to 2.0 μm wherein the thickness of the TiN gradient coating film accounts for 10 to 60% of the total thickness, and the total thickness of the Au—TiN mixture gradient coating film and the Au—TiN mixture coating film is in the range of 0.005 to 0.1 μm wherein the thickness of the Au—TiN mixture gradient coating film accounts for 10 to 90% of the total thickness.

The second golden ornament in accordance with the present invention is preferably characterized in that the thickness of the Ti coating film is in the range of 0.1 to 0.5 μm, the total thickness of the TiN gradient coating film and the TiN coating film is in the range of 0.5 to 2.0 μm wherein the thickness of the TiN gradient coating film accounts for 10 to 60% of the total thickness, the total thickness of the Au—TiN mixture gradient coating film and the Au—TiN mixture coating film is in the range of 0.005 to 0.1 μm wherein the thickness of the Au—TiN mixture gradient coating film accounts for 10 to 90% of the total thickness, and the thickness of the Au coating film or the Au alloy coating film is in the range of 0.005 to 0.1 μm.

In the first golden ornament in accordance with the present invention, each coating film has an excellent adhesion property to each other, and the Au—TiN mixture coating film that is an outermost layer has a high surface hardness, an excellent corrosion resistance, an excellent abrasion resistance, and an excellent mar resistance. In particular, the Au—TiN mixture gradient coating film has an excellent adhesion property to both the Au—TiN mixture coating film and the TiN coating film. Consequently, even when the Au—TiN mixture gradient coating film is extremely thin, an abrasion or a friction flaw hardly occurs on the surface of the golden ornament, and the coating films are hardly peeled. Therefore, the golden ornament can be obtained at a low cost using a reduced amount of gold.

In the second golden ornament in accordance with the present invention, the Au coating film or the Au alloy coating film is formed on the Au—TiN mixture coating film of the above first golden ornament. Each coating film has an excellent adhesion property to each other. The Au coating film and the Au alloy coating film that are outermost layers have a thin film thickness such that even when the outermost coating film is abraded or flawed, the color tone is hardly changed. Moreover, the Au—TiN mixture coating film under the Au coating film or the Au alloy coating film has a high surface hardness, an excellent corrosion resistance, an excellent abrasion resistance, and an excellent mar resistance. Accordingly, even when the Au coating film or the Au alloy coating film is abraded or flawed, the abrasion or flaw will not penetrate deeper. Furthermore, the Au—TiN mixture gradient coating film has an excellent adhesion property to both the Au—TiN mixture coating film and the TiN coating film. Consequently, even when the Au—TiN mixture coating film is extremely thin, the Au—TiN mixture coating film is not peeled and prevents an abrasion and a friction flaw of the golden ornament from going deeper than the Au—TiN mixture coating film. As a result, the golden ornament can retain a golden color and can be obtained at a low cost using a reduced amount of gold.

The processes for producing a golden ornament in accordance with the present invention can produce the above golden ornaments.

BEST MODE FOR CARRYING OUT THE INVENTION

Figure 1:
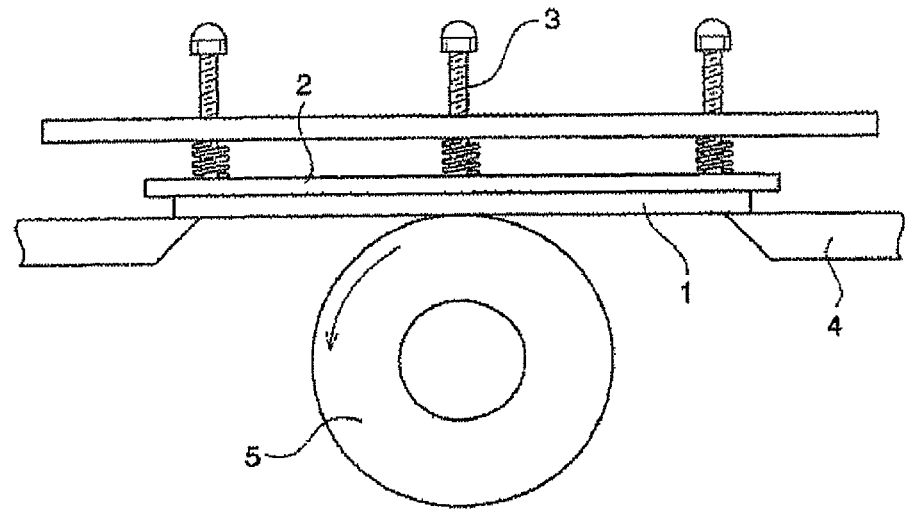
FIG. 1 is a schematic plan view showing an abrasion testing machine for illustrating a method of an abrasion test

The golden ornaments in accordance with the present invention and processes for producing the golden ornaments will be described below in detail.

A first golden ornament in accordance with the present invention can be fabricated by forming a Ti coating film on a surface of a base material, forming a TiN gradient coating film on the Ti coating film, forming a TiN coating film on the TiN gradient coating film, forming an Au—TiN mixture gradient coating film on the TiN coating film, and forming an Au—TiN mixture coating film on the Au—TiN mixture gradient coating film. These films are formed by a dry plating method.

A second golden ornament in accordance with the present invention can be fabricated by forming an Au coating film or an Au alloy coating film by a dry plating method, on the above Au—TiN mixture coating film.

The dry plating methods include vacuum vapor deposition, sputtering, and ion plating. Among them, the ion plating is preferably used.

Methods of forming the coating films will be described below in detail.

(1) Formation of Ti Coating Film

First, after a base material is disposed in a dry plating apparatus and the dry plating apparatus is evacuated, an inert gas other than nitrogen is introduced. Subsequently, titanium is evaporated constantly in an atmosphere of the inert gas in such a manner that titanium is evaporated in a constant amount per unit time to form a Ti coating film on a surface of the base material by a dry plating method. It is desirable that the evaporation amount of titanium per unit time is such that the film formation rate of the Ti coating film is preferably in the range of 0.005 to 0.05 μm/minute, more preferably in the range of 0.01 to 0.03 μm/minute.

Here, the dry plating apparatus is normally evacuated to 5 to 0.1 mPa, preferably 1 to 0.1 mPa, and thereafter the inert gas other than nitrogen is normally introduced to 0.01 to 1.0 Pa, preferably 0.1 to 0.5 Pa. Examples of the inert gases other than nitrogen include argon, helium and neon. It is preferable that the dry plating apparatus is evacuated to as low a pressure as possible, whereby the residual amount of unavoidable components (nitrogen, oxygen, and carbon) in the apparatus can be sufficiently reduced and the obtainable Ti coating film has a high purity.

Examples of the materials of the base material include stainless steel, titanium, titanium alloys, copper, copper alloys, tungsten carbide and ceramics. It is preferable to clean and degrease the surface of the base material using an organic solvent before the base material is disposed in the dry plating apparatus.

In the Ti coating film formed as described above, the content of Ti atoms is approximately uniform in the thickness direction. The Ti coating film may contain an unavoidable component composed of at least one of nitrogen, oxygen and carbon, and the content thereof is preferably in the range of 0.5 to 20 atom %, more preferably 0.5 to 12 atom %, particularly preferably 0.5 to 5 atom %. At this time, the content of Ti atoms is preferably in the range of 80 to 99.5 atom %, more preferably in the range of 88 to 99.5 atom %, further preferably in the range of 95 to 99.5 atom %.

The total content of Ti atoms and unavoidable components is 100 atom % in the above Ti coating film.

(2) Formation of TiN Gradient Coating Film

Subsequently to the above (1), while titanium is evaporated constantly in such a manner that the amount of Ti atoms is kept constant in the dry plating apparatus, a nitrogen gas is introduced in the dry plating apparatus. From the start of the introduction of the nitrogen gas, the nitrogen amount, that is, the amount of N atoms is increased with time in the dry plating apparatus. With the amount of N atoms being increased with time, a coating film containing Ti and N is formed on the Ti coating film by a dry plating method. In the coating film formed as described above, the contents of N atoms and Ti atoms have a gradient in the thickness direction (hereafter, this coating film is referred to as the TiN gradient coating film).

Here, it is preferable to increase the nitrogen amount in the dry plating apparatus with time such that the content of N atoms in the obtainable TiN gradient coating film is increased in the thickness direction at a rate of 4 to 12 atom %/0.1 μm, preferably 6 to 10 atom %/0.1 μm, more preferably 7 to 9 atom %/0.1 μm.

For instance, when the gas introduced is a mixture gas of a nitrogen gas and an inert gas such as argon, the nitrogen amount in the dry plating apparatus can be increased with time by increasing the ratio of the nitrogen gas in the mixture gas with time. Conditions for introducing the nitrogen gas are appropriately determined depending on the dry plating apparatus and plating conditions such that the TiN gradient coating film has the above gradient. For instance, the ratio of flow rates of the nitrogen gas and the inert gas (nitrogen gas/inert gas) is started from 0 and is preferably increased to 1.5 to 3.0, more preferably 1.8 to 2.5, preferably in 10 to 60 minutes, more preferably 20 to 40 minutes.

It is preferable that the evaporation amount of titanium per unit time is determined such that the film formation rate of the TiN gradient coating film is in the range of 0.005 to 0.05 μm/minute, more preferably in the range of 0.01 to 0.03 μm/minute. For instance, titanium is preferably evaporated in the same amount per unit time as that in which titanium is evaporated to form the Ti coating film.

It is preferable that the content of N atoms in the TiN gradient coating film formed as described above is increased in the thickness direction from the Ti coating film to a TiN coating film, and the content of Ti atoms in the TiN gradient coating film is decreased in the thickness direction from the Ti coating film to the TiN coating film. More specifically, it is preferable that the content of N atoms is increased at the above-described rate in the thickness direction from the Ti coating film to the TiN coating film. Moreover, it is preferable that the content of Ti atoms is decreased in the thickness direction from the Ti coating film to the TiN coating film at a rate of 4 to 12 atom %/0.1 μm, preferably 6 to 10 atom %/0.1 μm, more preferably 7 to 9 atom %/0.1 μm.

The TiN gradient coating film in which N atoms and Ti atoms are increased or decreased at the above respective rates has an excellent adhesion property to both the Ti coating film and the TiN coating film.

The TiN gradient coating film may contain an unavoidable component composed of at least one of oxygen and carbon, and the content thereof is preferably in the range of 0.5 to 20 atom %, more preferably 0.5 to 12 atom %, particularly preferably 0.5 to 5 atom %.

The total content of Ti atoms, N atoms and unavoidable components is 100 atom % in the above TiN gradient coating film.

(3) Formation of TiN Coating Film

Subsequently to the above (2), while a nitrogen gas is supplied constantly to the dry plating apparatus in such a manner that the nitrogen amount is kept constant in the dry plating apparatus, titanium is evaporated constantly in such a manner that the amount of Ti atoms is kept constant in the dry plating apparatus, thereby forming a TiN coating film on the TiN gradient coating film by a dry plating method.

Here, the nitrogen amount in the dry plating apparatus is kept constant such that the content of N atoms in the obtainable TiN coating film is preferably in the range of 10 to 60 atom %, more preferably 20 to 50 atom %, particularly preferably 30 to 45 atom %. The amount of the nitrogen gas supplied to the dry plating apparatus is determined appropriately depending on the dry plating apparatus and plating conditions such that the nitrogen amount in the dry plating apparatus is kept constant.

For instance, when the gas introduced is a mixture gas of a nitrogen gas and an inert gas such as argon, the ratio of flow rates of the nitrogen gas and the inert gas (nitrogen gas/inert gas) is preferably kept constant in the range of 1.5 to 3.0, more preferably in the range of 1.8 to 2.5.

It is preferable that the evaporation amount of titanium per unit time is determined such that the film formation rate of the TiN coating film is in the range of 0.005 to 0.05 µm/minute, more preferably in the range of 0.01 to 0.03 µm/minute. For instance, titanium is preferably evaporated in the same amount per unit time as that in which titanium is evaporated to form the Ti coating film.

In the TiN coating film formed as described above, the content of Ti atoms and the content of N atoms are approximately uniform in the thickness direction. The content of N atoms is in the above-described range, and the content of Ti atoms is preferably in the range of 30 to 80 atom %, more preferably in the range of 40 to 70 atom %, particularly preferably in the range of 45 to 60 atom %.

The TiN coating film may contain an unavoidable component composed of at least one of oxygen and carbon, and the content thereof is preferably in the range of 0.5 to 20 atom %, more preferably 0.5 to 12 atom %, particularly preferably 0.5 to 5 atom %.

The total content of Ti atoms, N atoms and unavoidable components is 100 atom % in the above TiN coating film.

(4) Formation of Au—Tin Mixture Gradient Coating Film

Subsequently to the above (3), while a nitrogen gas is supplied constantly to the dry plating apparatus in such a manner that the nitrogen amount is kept constant in the dry plating apparatus, titanium is evaporated constantly in such a manner that the amount of Ti atoms is kept constant in the dry plating apparatus. Here, the nitrogen gas is preferably supplied to the dry plating apparatus in an amount at least 2.5 times, more preferably at least 2.8 times as much as the amount of the nitrogen gas supplied in forming the TiN coating film. By supplying the nitrogen gas in an increased and constant amount as described above, the obtainable ornament displays an improved gold color.

It is preferable that the evaporation amount of titanium per unit time is determined such that the film formation rate of the Au—TiN mixture gradient coating film is in the range of 0.005 to 0.05 µm/minute, more preferably in the range of 0.01 to 0.03 µm/minute. For instance, titanium is preferably evaporated in the same amount per unit time as that in which titanium is evaporated to form the Ti coating film.

Under the above conditions, either gold or gold and a metal other than gold and titanium (hereafter referred to as the other metal) are evaporated in such a manner that the evaporation amount of gold per unit time is increased with time, thereby introducing Au atoms or Au atoms and atoms of the other metal in the dry plating apparatus. Subsequently, while the evaporation amount of gold per unit time is increased with time, a coating film containing Ti, N, Au, and the other metal as needed is formed on the TiN coating film by a dry plating method. By increasing the evaporation amount of gold per unit time with time as described above, the deposition amount of gold per unit time is increased with time. Consequently, a gradient film is produced in which the content of gold is increased in the direction of film growth. In the coating film formed as described above, the contents of Ti atoms, N atoms, Au atoms, and atoms of the other metal have a gradient in the thickness direction (hereafter, this coating film is referred to as the Au—TiN mixture gradient coating film).

Here, when the Au—TiN mixture gradient coating film does not contain the other metal, it is preferable to increase the evaporation amount of gold per unit time with time such that the content of Au atoms in the gradient coating film is preferably increased in the thickness direction at a rate of 2 to 10 atom %/0.001 µm, more preferably 4 to 9 atom %/0.001 µm, particularly preferably 6 to 8 atom %/0.001 µm. On the other hand, when the Au—TiN mixture gradient coating film contains the other metal, it is preferable to increase the evaporation amount of gold per unit time with time such that the total content of Au atoms and atoms of the other metal in the gradient coating film is preferably increased in the thickness direction at a rate of 2 to 10 atom %/0.001 µm, more preferably 4 to 9 atom %/0.001 µm, particularly preferably 6 to 8 atom %/0.001 µm.

For instance, when the Au—TiN mixture gradient coating film that does not contain the other metal is formed at a film formation rate of 0.02 µm/minute, it is preferable to evaporate gold such that the content of Au atoms in all the atoms deposited per unit time is preferably increased at a rate of 0.6 to 3.4 atom %/second, more preferably 1.3 to 3.0 atom %/second, particularly preferably 2.0 to 2.7 atom %/second. Similarly, when the Au—TiN mixture gradient coating film that contains the other metal is formed at a film formation rate of 0.02 µm/minute, it is preferable to evaporate gold and the other metal such that the total content of Au atoms and atoms of the other metal in all the atoms deposited per unit time is preferably increased at a rate of 0.6 to 3.4 atom %/second, more preferably 1.3 to 3.0 atom %/second, particularly preferably 2.0 to 2.7 atom %/second.

It is preferable that the content of Au atoms or the total content of Au atoms and atoms of the other metal in the Au—TiN mixture gradient coating film is increased in the thickness direction from the TiN coating film to an Au—TiN mixture coating film, and the contents of Ti atoms and N atoms in the Au—TiN mixture gradient coating film are decreased in the thickness direction from the TiN coating film to the Au—TiN mixture coating film. More specifically, it is preferable that the content of Au atoms or the total content of Au atoms and atoms of the other metal is increased at the above-described rate in the thickness direction from the TiN coating film to the Au—TiN mixture coating film. Moreover, it is preferable that the content of Ti atoms is decreased in the thickness direction from the TiN coating film to the Au—TiN mixture coating film at a rate of 1 to 10 atom %/0.001 μm, more preferably 2 to 8 atom %/0.001 μm, particularly preferably 3 to 5 atom %/0.001 μm. Furthermore, it is preferable that the content of N atoms is decreased in the thickness direction from the TiN coating film to the Au—TiN mixture coating film at a rate of 1 to 10 atom %/0.001 μm, more preferably 2 to 8 atom %/0.001 μm, particularly preferably 4 to 6 atom %/0.001 μm.

The Au—TiN mixture gradient coating film in which Au atoms, Ti atoms, and N atoms are increased or decreased at the above respective rates has an excellent adhesion property to both the TiN coating film and the Au—TiN mixture coating film.

When the Au—TiN mixture gradient coating film contains the other metal, it is preferable that Au atoms and atoms of the other metal form a gold alloy. Examples of the other metals include germanium, silicon, silver, copper, palladium, nickel, iron, platinum, niobium, and chromium. The content of the other metal is preferably in the range of 1 to 20 atom %, more preferably 3 to 15 atom %, particularly preferably 5 to 10 atom %.

The Au—TiN mixture gradient coating film may contain an unavoidable component composed of at least one of oxygen and carbon, and the content thereof is preferably in the range of 0.5 to 20 atom %, more preferably 0.5 to 12 atom %, particularly preferably 0.5 to 5 atom %.

The total content of Ti atoms, Au atoms, atoms of the other metal, N atoms, and unavoidable components is 100 atom % in the above Au—TiN mixture gradient coating film.

(5) Formation of Au—Tin Mixture Coating Film

Subsequently to the above (4), while a nitrogen gas is supplied constantly to the dry plating apparatus in such a manner that the nitrogen amount is kept constant in the dry plating apparatus, either titanium and gold, or titanium, gold and another metal are evaporated constantly in such a manner that the amount of Ti atoms and the amount of Au atoms are kept constant in the dry plating apparatus, thereby forming an Au—TiN mixture coating film on the Au—TiN mixture gradient coating film by a dry plating method.

Here, the nitrogen amount in the dry plating apparatus is kept constant such that the content of N atoms in the obtainable Au—TiN mixture coating film is preferably in the range of 5 to 50 atom %, more preferably 15 to 40 atom %, particularly preferably 20 to 30 atom %. Here, similarly to the production of the Au—TiN mixture gradient coating film, the nitrogen gas is preferably supplied to the dry plating apparatus in an amount at least 2.5 times, more preferably at least 2.8 times as much as the amount of the nitrogen gas supplied in forming the TiN coating film. By supplying the nitrogen gas in an increased and constant amount as described above, the ornament displays an improved gold color. Similarly to the production of the TiN coating film, the amount of the nitrogen gas supplied to the dry plating apparatus is determined appropriately depending on the dry plating apparatus and plating conditions such that the nitrogen amount in the dry plating apparatus is kept constant.

It is preferable that the evaporation amount of titanium per unit time is determined such that the film formation rate of the Au—TiN mixture coating film is in the range of 0.005 to 0.05 μm/minute, more preferably 0.01 to 0.03 μm/minute. For instance, titanium is preferably evaporated in the same amount per unit time as that in which titanium is evaporated to form the Ti coating film.

The evaporation amount of gold per unit time is kept constant such that the content of Au atoms in the obtainable Au—TiN mixture coating film is preferably in the range of 10 to 60 atom %, more preferably 20 to 55 atom %, particularly preferably 25 to 45 atom %.

In the Au—TiN mixture coating film formed as described above, the content of Au atoms, the content of Ti atoms, and the content of N atoms are approximately uniform in the thickness direction. Here, the content of Au atoms and the content of N atoms are in the above range, and the content of Ti atoms is preferably in the range of 10 to 60 atom %, more preferably in the range of 20 to 50 atom %, particularly preferably in the range of 30 to 45 atom %.

When the Au—TiN mixture coating film contains the other metal, it is preferable that Au atoms and atoms of the other metal form a gold alloy. Examples of the other metals include germanium, silicon, silver, copper, palladium, nickel, iron, platinum, niobium, and chromium. The content of the other metal is preferably in the range of 1 to 20 atom %, more preferably 3 to 15 atom %, particularly preferably 5 to 10 atom %.

The Au—TiN mixture coating film may contain an unavoidable component composed of at least one of oxygen and carbon, and the content thereof is preferably in the range of 0.5 to 20 atom %, more preferably 0.5 to 12 atom %, particularly preferably 0.5 to 5 atom %.

The total content of Ti atoms, Au atoms, atoms of the other metal, N atoms, and unavoidable components is 100 atom % in the above Au—TiN mixture coating film.

(6) Formation of Au Coating Film or Au Alloy Coating Film

For the second golden ornament in accordance with the present invention, subsequently to the above (5), the evaporation of titanium is stopped in the dry plating apparatus, and the supply of nitrogen to the dry plating apparatus is stopped. In this state, either gold or gold and another metal are evaporated in the dry plating apparatus to form an Au coating film or an Au alloy coating film as an outermost layer on the Au—TiN mixture coating film by a dry plating method.

It is preferable that the evaporation amount of gold per unit time is determined such that the film formation rate of the Au coating film or the Au alloy coating film is in the range of 0.005 to 0.05 μm/minute, more preferably in the range of 0.01 to 0.03 μm/minute. For instance, gold is preferably evaporated in the same amount per unit time as that in which gold is evaporated to form the Au—TiN mixture coating film.

In the present invention, it is preferable that the outermost layer is the Au alloy coating film because of excellent corrosion resistance. Examples of the other metals in the Au alloy coating film include palladium, nickel, platinum, iron, niobium, chromium, titanium, zirconium, hafnium, silicon, and boron. Among them, palladium and nickel are preferable in particular because of excellent corrosion resistance. The content of the other metal is preferably in the range of 3 to 30 atom %, more preferably 10 to 20 atom %, particularly preferably 12 to 18 atom %. When the content of the other metal is in the above range, the outermost layer shows excellent corrosion resistance and displays a color tone reflecting the color tone of the underlayer.

The Au coating film or the Au alloy coating film may contain an unavoidable component composed of at least one of nitrogen, oxygen and carbon, and the content thereof is preferably in the range of 0.5 to 20 atom %, more preferably 0.5 to 12 atom %, particularly preferably 0.5 to 5 atom %.

The total content of Au atoms, atoms of the other metal, and unavoidable components is 100 atom % in the above Au coating film or the Au alloy coating film.

The golden ornaments in accordance with the present invention can be fabricated by the above producing processes. In both the first and second golden ornaments, the Au—TiN mixture coating film and the TiN coating film are laminated via the Au—TiN mixture gradient coating film, thereby achieving an improved adhesion property. Consequently, the Au—TiN mixture coating film can be formed in an extremely small thickness. Moreover, in the second golden ornament, because the Au—TiN mixture coating film has a high surface hardness, the Au coating film or the Au alloy coating film can be formed in an extremely small thickness. Furthermore, since the Au coating film or the Au alloy coating film is extremely thin, the color tone is hardly changed even when the coating film is abraded or flawed. Accordingly, the golden ornament does not display conspicuous abrasion flaws and marring flaws on the surface.

In the above golden ornaments, since the Au—TiN mixture coating film can be extremely thin, the thickness of the TiN coating film may be increased to achieve an improved strength of the laminate.

The coating films of the golden ornaments preferably have the following thickness. The thickness of the Ti coating film is preferably in the range of 0.1 to 0.5 μm, more preferably 0.2 to 0.5 μm, particularly preferably 0.3 to 0.5 μm.

The total thickness of the TiN gradient coating film and the TiN coating film is preferably in the range of 0.5 to 2.0 μm, more preferably 0.7 to 1.8 μm, particularly preferably 1.0 to 1.5 μm. The thickness of the TiN gradient coating film preferably accounts for 10 to 60%, more preferably 20 to 55%, particularly preferably 30 to 50% of the total thickness of the TiN gradient coating film and the TiN coating film. When the thickness of the TiN gradient coating film accounts for more than the upper limit, the proportion of the TiN coating film is reduced such that the strength of the film can be decreased.

The total thickness of the Au—TiN mixture gradient coating film and the Au—TiN mixture coating film is preferably in the range of 0.005 to 0.1 μm, more preferably 0.005 to 0.05 μm, particularly preferably 0.01 to 0.02 μm. The thickness of the Au—TiN mixture gradient coating film preferably accounts for 10 to 90%, more preferably 20 to 70%, particularly preferably 30 to 50% of the total thickness of the Au—TiN mixture gradient coating film and the Au—TiN mixture coating film. When the ratio of the thickness of the Au—TiN mixture gradient coating film is as described above, the Au—TiN mixture coating film has a sufficient film strength, and the Au—TiN mixture coating film and the TiN coating film are not separated. In addition, the first golden ornament displays an improved gold color.

In the second golden ornament, the thickness of the Au coating film or the Au alloy coating film is preferably in the range of 0.005 to 0.1 μm, more preferably 0.005 to 0.05 μm, particularly preferably 0.005 to 0.02 μm. When the thickness of the Au coating film or the Au alloy coating film is in the above range, the second golden ornament displays a bright gold color tone. Moreover, even when the coating film is abraded or flawed, the color tone is hardly changed, and the golden ornament does not display conspicuous flaws by abrasion or marring on the surface. When the thickness of each layer is in the above range, the layers are not separated from one another and the golden ornament shows an excellent adhesion property.

In the first golden ornament, the outermost coating film has a high hardness, and the Vickers hardness measured using a nanoindenter at a load of 50 μN is preferably in the range of 500 to 800 Hv, more preferably 600 to 700 Hv. In the second golden ornament, the Au—TiN mixture coating film has a high hardness, and the Vickers hardness measured using a nanoindenter at a load of 50 μN is preferably in the range of 500 to 800 Hv, more preferably 600 to 700 Hv. Consequently, even when the outermost Au coating film or Au alloy coating film is damaged by abrasion or marring, the underlying Au—TiN mixture coating film can prevent the damage from penetrating deeper. Hardness of outermost layers of conventional golden ornaments is approximately 370 Hv.

EMBODIMENT

While the preferred embodiments of the present invention will be described below, the present invention is not restricted to the embodiments. A corrosion resistance test and an abrasion test in the embodiments were carried out based on the following methods.

(1) Corrosion Resistance Test

The corrosion resistance test was carried out in accordance with JIS H8502 (CASS test). The test time was 96 hours. The corrosion resistance of a surface of a test piece was evaluated to be acceptable when the rating number was 9.8 or higher based on the rating number standard chart.

(2) Abrasion Test

As shown in FIG. 1, a test piece 1 having coating films was placed on an opening portion of a test piece mount 4 such that the coating films were downward, and the test piece was fixed using a test piece presser bar 2 and test piece presser screws 3. Polishing paper (not shown) was bonded to an abrasion ring 5. The abrasion ring 5 received an upward load from a balance mechanism (not shown) so that the polishing paper was pressed against the test piece 1.

Subsequently, the test piece mount 4 was moved back and forth by a mechanism that converted a rotational motion of a motor (not shown) to a reciprocating motion. In addition, the abrasion ring 5 was rotated 0.9 degree in the direction of the arrow after every one reciprocating motion of the test piece mount 4. By this rotation, the test piece 1 was constantly in contact with an unworn region of the polishing paper bonded to the abrasion ring 5. The number of reciprocating motions of the test piece mount 4 was automatically controlled. The abrasion test machine stopped automatically when the preset number was reached.

The polishing paper bonded to the abrasion ring 5 was a lapping film (#1200, the film surface had $Al_2O_3$ particles having a diameter of 12 μm). In the abrasion test, the polishing paper was pressed against the test piece 1 at a load of 500 g, and the test piece mount 4 was reciprocated 100 times. The abrasion test machine used was NUS-ISO-2 manufactured by SUGA TEST INSTRUMENTS Co., Ltd.

Comparative Example 1

A mirror-finished wristwatch case obtained by machining stainless steel (SUS316L) was cleaned and degreased using an organic solvent. This base material was disposed in an ion plating apparatus.

Subsequently, the apparatus was evacuated to 1.3 mPa, and an argon gas was introduced to 0.13 Pa. In the argon atmosphere, plasma was generated by a plasma gun provided in the apparatus. Titanium was evaporated constantly for ten minutes, thereby forming a Ti coating film having a thickness of 0.2 μm on a surface of the base material for a wristwatch.

While titanium was evaporated under the same conditions as those in forming the Ti coating film, the introduction gas was changed from the argon gas to a mixture gas of a nitrogen gas and an argon gas. Here, the gas flow rate was maintained constant at 300 sccm, but the ratio of flow rates of the nitrogen gas and the argon gas ($N_2/Ar$) was increased from 0 to 2.0 in 35 minutes. As a result, a TiN gradient coating film having a thickness of 0.6 μm was formed on the Ti coating film.

Subsequently, under the same conditions as those at completion of forming the Ti coating film, the evaporation of titanium and the supply of the mixture gas of nitrogen and argon were continued constantly. Consequently, a TiN coating film having a thickness of 0.6 μm was formed on the TiN gradient coating film.

Thereafter, the evaporation of titanium and the supply of the nitrogen gas were stopped, and gold was evaporated while supplying the argon gas to form a film at a rate of 0.02 μm/minute for 30 seconds. Consequently, an Au coating film having a thickness of 0.01 μm was formed on the TiN coating film.

The obtained wristwatch case had a uniform gold color tone.

The corrosion resistance test was carried out for the obtained wristwatch case, resulting in a rating number of 9.8. Moreover, the wristwatch case was subjected to the abrasion test. A difference of color ($\Delta E^*ab$) before and after the test was measured using a calorimeter (manufactured by MINOLTA, INC.), resulting in 6.54. Furthermore, an abrasion flaw was found by visual observation of the surface.

Embodiment 1

A mirror-finished wristwatch case obtained by machining stainless steel (SUS316L) was cleaned and degreased using an organic solvent. This base material was disposed in an ion plating apparatus.

Subsequently, the apparatus was evacuated to 1.3 mPa, and an argon gas was introduced to 0.13 Pa. In the argon atmosphere, plasma was generated by a plasma gun provided in the apparatus. Titanium was evaporated constantly for ten minutes, thereby forming a Ti coating film having a thickness of 0.2 μm on a surface of the base material for a wristwatch.

While titanium was evaporated under the same conditions as those in forming the Ti coating film, the introduction gas was changed from the argon gas to a mixture gas of a nitrogen gas and an argon gas. Here, the gas flow rate was maintained constant at 300 sccm, but the ratio of flow rates of the nitrogen gas and the argon gas ($N_2/Ar$) was increased from 0 to 2.0 in 35 minutes. As a result, a TiN gradient coating film having a thickness of 0.6 μm was formed on the Ti coating film.

Subsequently, under the same conditions as those at completion of forming the Ti coating film, the evaporation of titanium and the supply of the mixture gas of nitrogen and argon were continued constantly. Consequently, a TiN coating film having a thickness of 0.6 μm was formed on the TiN gradient coating film.

Titanium was evaporated constantly under the same conditions as those in forming the TiN coating film, and gold was evaporated while the mixture gas of nitrogen and argon was supplied at a flow rate of 680 sccm in which the ratio of flow rates ($N_2/Ar$) was 5.8. As a result, an Au—TiN mixture gradient coating film having a thickness of 0.005 μm was formed on the TiN coating film. Here, the evaporation amount of gold per unit time was increased with time such that the content of Au atoms was increased by 2.67 atom % per second relative to the deposition amount of all the atoms per unit time. More specifically, the Au—TiN mixture gradient coating film was formed at a film formation rate of 0.02 μm/minute for 15 seconds, and the evaporation amount of gold was increased with time such that the content of Au atoms in the Au—TiN mixture gradient coating film was increased at a rate of 8 atom %/0.001 μm in the direction of film growth.

Subsequently, under the same conditions as those at completion of forming the Au—TiN mixture gradient coating film, the evaporation of titanium and gold and the supply of the mixture gas of nitrogen and argon were continued constantly. Consequently, an Au—TiN mixture coating film having a thickness of 0.01 μm was formed on the Au—TiN mixture gradient coating film.

The obtained wristwatch case had a uniform gold color tone.

The corrosion resistance test was carried out for the obtained wristwatch case, resulting in a rating number of 9.9. Moreover, the wristwatch case was subjected to the abrasion test. Although a slight abrasion flaw was found on the surface, the abrasion resistance and mar resistance were sufficient. Moreover, the Au—TiN mixture coating film was not removed.

Figure 2:
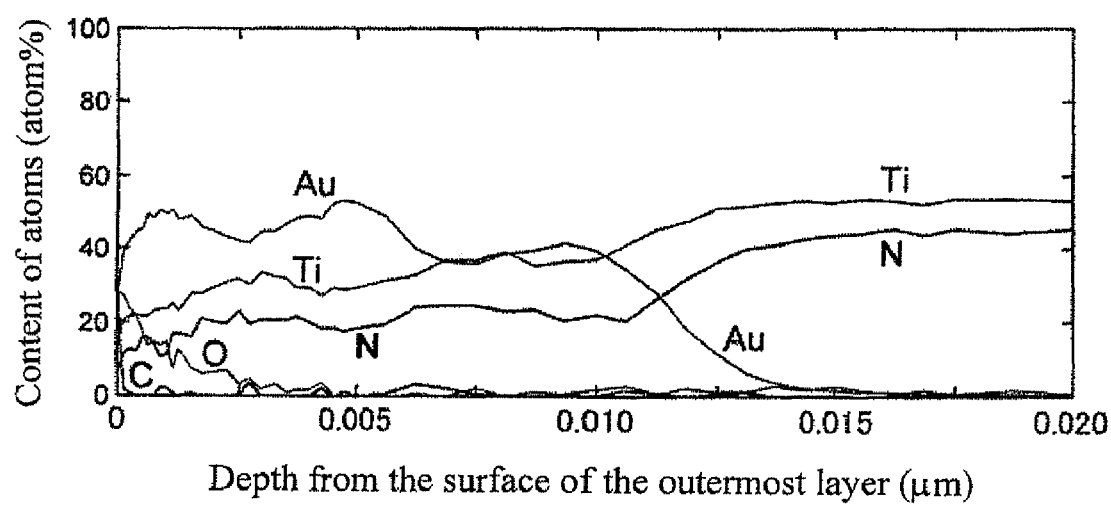
FIG. 2 is a graph showing results of composition analysis in the thickness direction of coating films of a watch case produced in Example 1

The composition of the obtained wristwatch case was analyzed by electron spectroscopy for chemical analysis (ESCA). As a result, the Au—TiN mixture coating film was composed of 40 atom % of gold, 38 atom % of titanium, 20 atom % of nitrogen, 1 atom % of oxygen, and 1 atom % of carbon. Moreover, the TiN coating film was composed of 54 atom % of titanium, 45 atom % of nitrogen, 0.5 atom % of oxygen, and 0.5 atom % of carbon. Furthermore, in the Au—TiN mixture gradient coating film, the content of Au atoms was increased at a rate of 8 atom %/0.001 μm, the content of Ti atoms was decreased at a rate of 3.2 atom %/0.001 μm, and the content of N atoms was decreased at a rate of 5 atom %/0.001 μm. Furthermore, in the TiN gradient coating film, the content of N atoms was increased at a rate of 7.5 atom %/0.1 μm, and the content of Ti atoms was decreased at a rate of 7.7 atom %/0.1 μm. FIG. 2 shows composition changes in the wristwatch case in the thickness direction from the Au—TiN mixture coating film to the TiN coating film.

Figure 3:
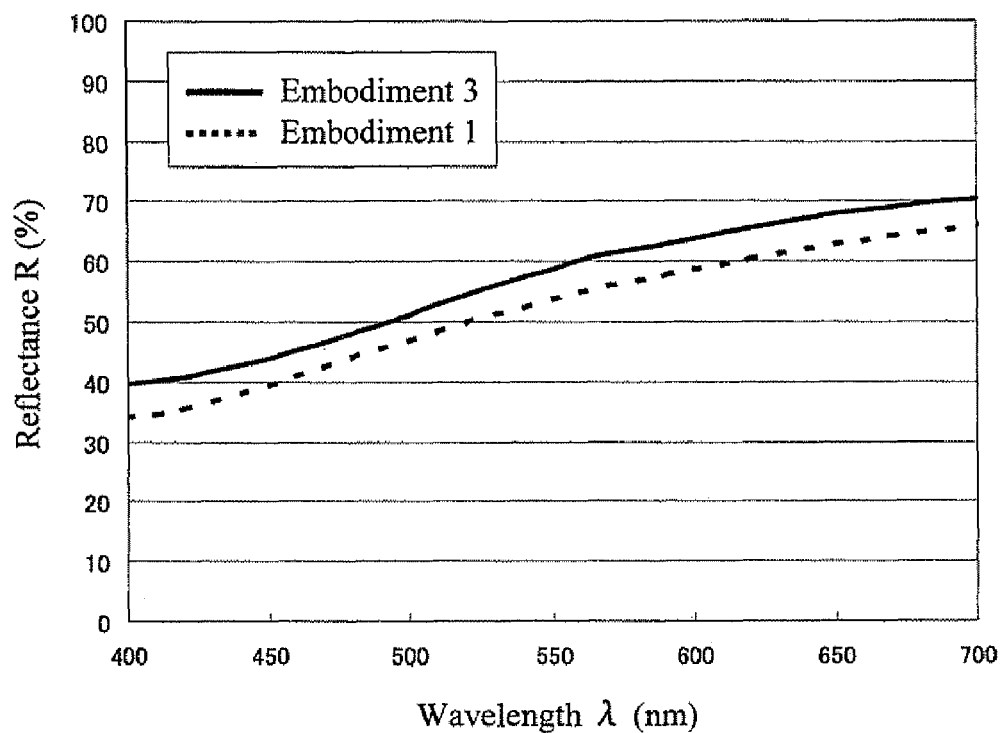
FIG. 3 is a graph showing measurement results of surface reflectance at wavelengths in the range of 400 to 700 nm for watch cases produced in Examples 1 and 3.

FIG. 3 shows results of measurement of surface reflectance at wavelengths in the range of 400 to 700 nm of the wristwatch case.

Embodiment 2

A mirror-finished wristwatch case obtained by machining stainless steel (SUS316L) was cleaned and degreased using an organic solvent. This base material was disposed in an ion plating apparatus.

Subsequently, the apparatus was evacuated to 1.3 mPa, and an argon gas was introduced to 0.13 Pa. In the argon atmosphere, plasma was generated by a plasma gun provided in the apparatus. Titanium was evaporated constantly for ten minutes, thereby forming a Ti coating film having a thickness of 0.2 μm on a surface of the base material for a wristwatch.

While titanium was evaporated under the same conditions as those in forming the Ti coating film, the introduction gas was changed from the argon gas to a mixture gas of a nitrogen gas and an argon gas. Here, the gas flow rate was maintained constant at 300 sccm, but the ratio of flow rates of the nitrogen gas and the argon gas ($N_2/Ar$) was increased from 0 to 2.0 in 35 minutes. As a result, a TiN gradient coating film having a thickness of 0.6 μm was formed on the Ti coating film.

Subsequently, under the same conditions as those at completion of forming the Ti coating film, the evaporation of titanium and the supply of the mixture gas of nitrogen and argon were continued constantly. Consequently, a TiN coating film having a thickness of 0.6 μm was formed on the TiN gradient coating film.

Titanium was evaporated constantly under the same conditions as those in forming the TiN coating film, and gold was evaporated while the mixture gas of nitrogen and argon was supplied at a flow rate of 680 sccm in which the ratio of flow rates ($N_2/Ar$) was 5.8. As a result, an Au—TiN mixture gradient coating film having a thickness of 0.005 μm was formed on the TiN coating film. Here, the evaporation amount of gold per unit time was increased with time such that the content of Au atoms was increased by 2.67 atom % per second relative to the deposition amount of all the atoms per unit time. More specifically, the Au—TiN mixture gradient coating film was formed at a film formation rate of 0.02 μm/minute for 15 seconds, and the evaporation amount of gold was increased with time such that the content of Au atoms in the Au—TiN mixture gradient coating film was increased at a rate of 8 atom %/0.001 μm in the direction of film growth.

Subsequently, under the same conditions as those at completion of forming the Au—TiN mixture gradient coating film, the evaporation of titanium and gold and the supply of the mixture gas of nitrogen and argon were continued constantly. Consequently, an Au—TiN mixture coating film having a thickness of 0.01 μm was formed on the Au—TiN mixture gradient coating film.

Thereafter, the evaporation of titanium and the supply of the nitrogen gas were stopped, and the evaporation of gold and the supply of the argon gas were continued under the same conditions as those at completion of forming the Au—TiN mixture coating film. Consequently, an Au coating film having a thickness of 0.01 μm was formed on the Au—TiN mixture coating film.

The obtained wristwatch case had a uniform gold color tone.

The corrosion resistance test was carried out for the obtained wristwatch case, resulting in a rating number of 9.9. Moreover, the wristwatch case was subjected to the abrasion test. Although a very slight abrasion flaw was found on the surface, the degree of the flaw was lower than that of Embodiment 1. Moreover, the Au—TiN mixture coating film was not removed.

Embodiment 3

A mirror-finished wristwatch case obtained by machining stainless steel (SUS316L) was cleaned and degreased using an organic solvent. This base material was disposed in an ion plating apparatus.

Subsequently, the apparatus was evacuated to 1.3 mPa, and an argon gas was introduced to 0.13 Pa. In the argon atmosphere, plasma was generated by a plasma gun provided in the apparatus. Titanium was evaporated constantly for ten minutes, thereby forming a Ti coating film having a thickness of 0.2 μm on a surface of the base material for a wristwatch.

While titanium was evaporated under the same conditions as those in forming the Ti coating film, the introduction gas was changed from the argon gas to a mixture gas of a nitrogen gas and an argon gas. Here, the gas flow rate was maintained constant at 300 sccm, but the ratio of flow rates of the nitrogen gas and the argon gas ($N_2/Ar$) was increased from 0 to 2.0 in 35 minutes. As a result, a TiN gradient coating film having a thickness of 0.6 μm was formed on the Ti coating film.

Subsequently, under the same conditions as those at completion of forming the Ti coating film, the evaporation of titanium and the supply of the mixture gas of nitrogen and argon were continued constantly. Consequently, a TiN coating film having a thickness of 0.6 μm was formed on the TiN gradient coating film.

Titanium was evaporated constantly under the same conditions as those in forming the TiN coating film, and gold and palladium were evaporated while the mixture gas of nitrogen and argon was supplied at a flow rate of 680 sccm in which the ratio of flow rates ($N_2/Ar$) was 5.8. As a result, an Au—TiN mixture gradient coating film having a thickness of 0.005 μm was formed on the TiN coating film. Here, the evaporation amounts of gold and palladium per unit time were increased with time such that the total content of Au atoms and Pd atoms was increased by 2.67 atom % per second relative to the deposition amount of all the atoms per unit time. More specifically, the Au—TiN mixture gradient coating film was formed at a film formation rate of 0.02 μm/minute for 15 seconds, and the evaporation amount of gold was increased with time such that the total content of Au atoms and Pd atoms in the Au—TiN mixture gradient coating film was increased at a rate of 8 atom %/0.001 μm in the direction of film growth. The ratio of Au and Pd was 85 atom %:15 atom %.

Subsequently, under the same conditions as those at completion of forming the Au—TiN mixture gradient coating film, the evaporation of titanium, gold and palladium, and the supply of the mixture gas of nitrogen and argon were continued constantly. Consequently, an Au—TiN mixture coating film having a thickness of 0.01 μm was formed on the Au—TiN mixture gradient coating film. The ratio of Au and Pd was 85 atom %:15 atom %.

Thereafter, the evaporation of titanium and the supply of the nitrogen gas were stopped, and the evaporation of gold and palladium and the supply of the argon gas were continued under the same conditions as those at completion of forming the Au—TiN mixture coating film. Consequently, an Au—Pd alloy coating film having a thickness of 0.01 μm was formed on the Au—TiN mixture coating film. The ratio of Au and Pd was 85 atom %:15 atom %.

The obtained wristwatch case had a uniform gold color tone. The surface reflectance of the wristwatch case was measured at wavelengths in the range of 400 to 700 nm. The results are shown in FIG. 3. The results show that the wristwatch case in which the outermost Au—Pd alloy coating film was on the underlying Au—TiN mixture coating film had higher surface reflectance and was brighter as compared with the wristwatch case in which the outermost layer was the Au—TiN mixture coating film (Embodiment 1).

The corrosion resistance test was carried out for the obtained wristwatch case, resulting in a rating number of 9.9. Moreover, the wristwatch case was subjected to the abrasion test. A difference of color ($\Delta E^*ab$) before and after the test was measured using a calorimeter (manufactured by MINOLTA, INC.), resulting in 2.94. As was the case with Embodiment 2, a very slight abrasion flaw was found on the surface. These results show that even when the outermost layer was the Au—Pd alloy coating film on the underlying Au—TiN mixture coating film, such wristwatch case changed the color tone only slightly before and after the abrasion test and did not had a conspicuous abrasion, as compared with the wristwatch case in which the underlying layer was the TiN coating film (Comparative example 1). Moreover, the Au—TiN mixture coating film was not removed.

Figure 4:
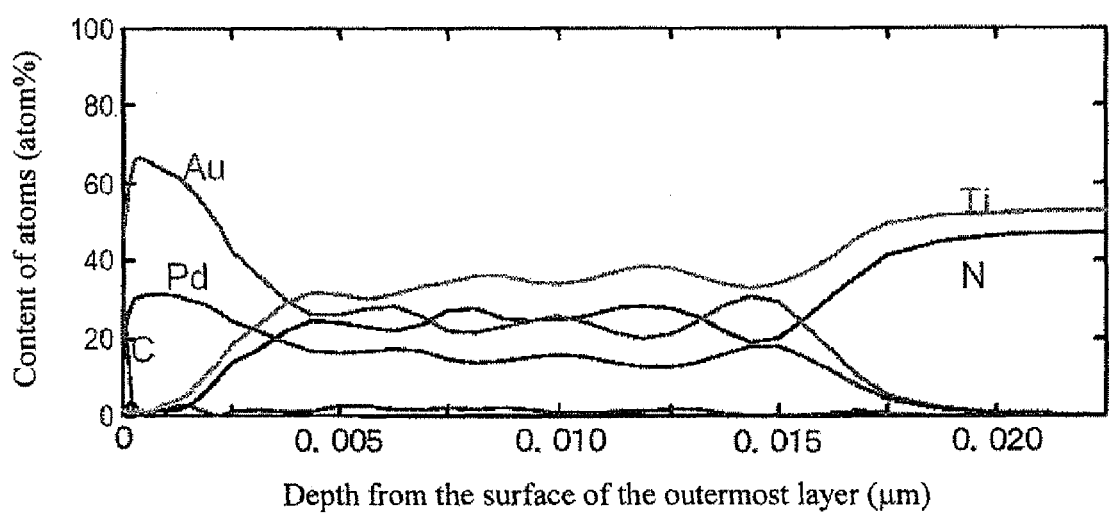
FIG. 4 is a graph showing results of composition analysis in the thickness direction of coating films of a watch case produced in Example 3.

The composition of the obtained wristwatch case was analyzed by electron spectroscopy for chemical analysis (ESCA) As a result, the Au alloy coating film was composed of 85 atom % of gold and 15 atom % of palladium. Moreover, the Au—TiN mixture coating film was composed of 40 atom % of gold, 7 atom % of palladium, 31 atom % of titanium, 20 atom % of nitrogen, 1 atom % of oxygen, and 1 atom % of carbon. Furthermore, the TiN coating film was composed of 54 atom % of titanium, 45 atom % of nitrogen, 0.5 atom % of oxygen, and 0.5 atom % of carbon. Furthermore, in the Au—TiN mixture gradient coating film, the total content of Au atoms and Pd atoms was increased at a rate of a atom %/0.001 μm, the content of Ti atoms was decreased at a rate of 3.2 atom %/0.001 μm, and the content of N atoms was decreased at a rate of 5 atom %/0.001 μm. Furthermore, in the TiN gradient coating film, the content of N atoms was increased at a rate of 7.5 atom %/0.1 μm, and the content of Ti atoms was decreased at a rate of 7.7 atom %/0.1 μm. FIG. 4 shows composition changes in the wristwatch case in the thickness direction from the Au—TiN mixture coating film to the TiN coating film.

The present invention can be applied to, for instance, watch exterior components such as wristwatch cases, wristwatch bands, winding buttons and rear covers, belt buckles, rings, necklaces, bracelets, earrings, pendants, brooches, cuff links, tie pins, badges, medals, eyeglass frames, camera bodies and doorknobs.

The invention claimed is:

1. A process for producing a golden ornament, comprising the steps of:
    forming a Ti coating film on a surface of a base material by evaporating titanium in a dry plating apparatus in an atmosphere of an inert gas other than nitrogen in such a manner that titanium is evaporated in a constant amount per unit time;
    forming a TiN gradient coating film whose N atom content has a gradient in the thickness direction on the Ti coating film by introducing a nitrogen gas in the dry plating apparatus in such a manner that the nitrogen amount is increased with time in the dry plating apparatus while evaporating titanium in the dry plating apparatus in such a manner that titanium is evaporated in a constant amount per unit time;
    forming a TiN coating film on the TiN gradient coating film by keeping the nitrogen amount constant in the dry plating apparatus while evaporating titanium in the dry plating apparatus in such a manner that titanium is evaporated in a constant amount per unit time;
    forming an Au—TiN mixture gradient coating film whose Au atom content has a gradient in the thickness direction on the TiN coating film by evaporating either gold or gold and another metal in such a manner that the evaporation amount of gold per unit time is increased with time, while evaporating titanium in the dry plating apparatus in such a manner that titanium is evaporated in a constant amount per unit time and the nitrogen amount is kept constant in the dry plating apparatus;
    forming an Au—TiN mixture coating film on the Au—TiN mixture gradient coating film by evaporating either titanium and gold, or titanium, gold and another metal in the dry plating apparatus in such a manner that either titanium and gold, or titanium, gold and the another metal are evaporated in a constant amount per unit time while the nitrogen amount is kept constant in the dry plating apparatus; and
    wherein the total thickness of the Au—TiN mixture gradient coating film and the Au—TiN mixture coating film is in the range of 0.005 to 0.1 μm and the thickness of the Au—TiN mixture gradient coating film accounts for 10 to 90% of the total thickness.

2. The process for producing a golden ornament according to claim 1, wherein after the Au—TiN mixture coating film is formed, the evaporation of titanium in the dry plating apparatus is stopped and the supply of nitrogen to the dry plating apparatus is stopped, and either gold or gold and a metal other than gold and titanium are evaporated in the dry plating apparatus to form an Au coating film or an Au alloy coating film on the Au—TiN mixture coating film.

3. The process for producing a golden ornament according to claim 2, wherein Au atoms in the Au—TiN mixture gradient coating film and the Au—TiN mixture coating film form an alloy with a metal other than gold and titanium and an Au alloy coating film is formed on the Au—TiN mixture coating film.

4. The process for producing a golden ornament according to claim 2, wherein when the Au—TiN mixture gradient coating film is formed, the evaporation amount of gold per unit time is increased with time in such a manner that the content of Au atoms in the Au—TiN mixture gradient coating film is increased in the thickness direction at a rate of 2 to 10 atom %/0.001 μm.

5. The process for producing a golden ornament according to claim 2, wherein when the Au—TiN mixture gradient coating film is formed, a nitrogen gas is supplied to the dry plating apparatus in an amount at least 2.5 times as much as the amount of a nitrogen gas supplied in forming the TiN coating film.

6. The process for producing a golden ornament according to claim 2, wherein when the Au—TiN mixture coating film is formed, a nitrogen gas is supplied to the dry plating apparatus in an amount at least 2.5 times as much as the amount of a nitrogen gas supplied in forming the TiN coating film.

7. The process for producing a golden ornament according to claim 1, wherein when the Au—TiN mixture gradient coating film is formed, the evaporation amount of gold per unit time is increased with time in such a manner that the content of Au atoms in the Au—TiN mixture gradient coating film is increased in the thickness direction at a rate of 2 to 10 atom %/0.001 μm.

8. The process for producing a golden ornament according to claim 1, wherein when the Au—TiN mixture gradient coating film is formed, a nitrogen gas is supplied to the dry plating apparatus in an amount at least 2.5 times as much as the amount of a nitrogen gas supplied in forming the TiN coating film.

9. The process for producing a golden ornament according to claim 1, wherein when the Au—TiN mixture coating film is formed, a nitrogen gas is supplied to the dry plating apparatus in an amount at least 2.5 times as much as the amount of a nitrogen gas supplied in forming the TiN coating film.

10. The process for producing a golden ornament according to claim 1, wherein when the TiN gradient coating film is formed, the nitrogen amount in the dry plating apparatus is increased with time in such a manner that the content of N atoms in the TiN gradient coating film is increased in the thickness direction at a rate of 4 to 12 atom %/0.1 μm.

11. A golden ornament comprising:
    a base material;
    a Ti coating film which is formed on a surface of the base material in an atmosphere of an inert gas other than nitrogen and whose Ti atom content is constant in the thickness direction;
    a TiN gradient coating film which is formed on the Ti coating film and whose N atom content has a gradient in the thickness direction;
    a TiN coating film which is formed on the TiN gradient coating film and whose contents of Ti atoms and N atoms are constant in the thickness direction;
    an Au—TiN mixture gradient coating film which is formed on the TiN coating film and whose Au atom content has a gradient in the thickness direction; and an Au—TiN mixture coating film which is formed on the Au—TiN mixture gradient coating film and whose contents of Au atoms, Ti atoms and N atoms are constant in the thickness direction; and wherein the total thickness of the Au—TiN mixture gradient coating film and the Au—TiN mixture coating film is in the range of 0.005 to 0.1 μm and the thickness of the Au—TiN mixture gradient coating film accounts for 10 to 90% of the total thickness.

12. The golden ornament according to claim 11, further comprising an Au coating film or an Au alloy coating film which is formed on the Au—TiN mixture coating film and whose Au atom content is constant in the thickness direction.

13. The golden ornament according to claim 12, wherein Au atoms in the Au—TiN mixture coating film form an alloy with a metal other than gold and titanium to form an Au alloy coating film on the Au—TiN mixture coating film.

14. The golden ornament according to claim 12, wherein the thickness of the Ti coating film is in the range of 0.1 to 0.5 μm, the total thickness of the TiN gradient coating film and the TiN coating film is in the range of 0.5 to 2.0 μm wherein the thickness of the TiN gradient coating film accounts for 10 to 60% of the total thickness, and the thickness of the Au coating film or the Au alloy coating film is in the range of 0.005 to 0.1 μm.

15. The golden ornament according to claim 11, wherein the content of Au atoms in the Au—TiN mixture gradient coating film is increased in the thickness direction from the TiN coating film to the Au—TiN mixture coating film.

16. The golden ornament according to claim 15, wherein the Au—TiN mixture gradient coating film does not contain metal atoms other than gold and titanium and the content of Au atoms is increased at a rate of 2 to 10 atom %/0.001 μm.

17. The golden ornament according to claim 15, wherein Au atoms in the Au—TiN mixture gradient coating film form an alloy with a metal other than gold and titanium, and the total content of Au atoms and atoms of the metal other than gold and titanium is increased at a rate of 2 to 10 atom %/0.001 μm.

18. The golden ornament according to claim 11, wherein the content of N atoms in the TiN gradient coating film is increased in the thickness direction from the Ti coating film to the TiN coating film.

19. The golden ornament according to claim 18, wherein the content of N atoms in the TiN gradient coating film is increased at a rate of 4 to 12 atom %/0.1 μm.

20. The golden ornament according to claim 11, wherein the thickness of the Ti coating film is in the range of 0.1 to 0.5 μm, the total thickness of the TiN gradient coating film and the TiN coating film is in the range of 0.5 to 2.0 μm wherein the thickness of the TiN gradient coating film accounts for 10 to 60% of the total thickness.

* * * * *

UNITED STATES PATENT AND TRADEMARK OFFICE
CERTIFICATE OF CORRECTION

PATENT NO. : 7,771,836 B2  Page 1 of 1
APPLICATION NO. : 11/910163
DATED : August 10, 2010
INVENTOR(S) : Naoi et al.

It is certified that error appears in the above-identified patent and that said Letters Patent is hereby corrected as shown below:

Column 18, line 67, Claim 11, "direction; and" should read -- direction; --

Signed and Sealed this

Sixteenth Day of November, 2010

David J. Kappos
*Director of the United States Patent and Trademark Office*